March 11, 1958 R. L. GRAY 2,826,695

TRANSISTOR BISTABLE OSCILLATOR

Filed May 26, 1955

*INVENTOR.*
ROBERT L. GRAY

*BY* Laurence R. Brown

ATTORNEY

United States Patent Office 2,826,695

Patented Mar. 11, 1958

2,826,695

TRANSISTOR BISTABLE OSCILLATOR

Robert L. Gray, Broomall, Pa., assignor to Burroughs Corporation, Detroit, Mich., a corporation of Michigan Application May 26, 1955, Serial No. 511,376

4 Claims. (Cl. 250—36)

This invention relates generally to oscillators and more particularly to a bistable state oscillator circuit utilizing a transistor.

Bistable oscillators which produce a carrier type signal are known in the prior art. Many such types of bistable oscillators utilize electronic devices such as vacuum tubes. Vacuum tubes, however, are bulky and require a large amount of power compared to a transistor. Consequently, a bistable oscillator circuit utilizing a transistor would reduce bulk and power requirements to a minimum, so that use in airborne equipment or in computer equipment generally will become more feasible.

Therefore, one of the objects of the present invention is to provide an improved bistable state oscillator circuit utilizing a transistor.

Another purpose of the invention is to produce carrier type signals from a simplified transistor circuit.

Another object of the invention is to produce a circuit for converting two different polarity direct current pulses into corresponding carrier signals representing oscillating and non-oscillating circuit conditions.

In accordance with one embodiment of the invention there is provided a transistor having electrodes coupled at a base terminal, a collector terminal, and an emitter terminal. A capacitor is connected between the emitter terminal and the collector terminal, and an inductor is connected with one terminal in common with the emitter terminal and the capacitor. Battery means or some other bias supply source may be connected in series with the inductor to produce bias for the emitter terminal negative with respect to the base terminal so that the transistor will normally reside in a non-conductive state. Another power supply is provided to bias the collector terminal negative with respect to the base terminal. An input pulse source is provided to selectively apply positive or negative input pulses to the emitter terminal. The positive pulse is of sufficient amplitude to cause the transistor to begin oscillating when in a non-conductive condition and the negative pulses are adapted to cause the transistor to become non-conductive when in an oscillating condition. Thus, in accordance with one feature of the invention, the capacitor and the inductor form an oscillatory circuit which will cause the transistor, in response to a positive pulse from the input source, to alternately become conductive and non-conductive with each oscillation cycle.

These and other objects and features of the invention will become more readily understood from the following detailed description when read in conjunction with the drawing, in which.

Figures 1, 2, 3, 4, 5, 6, 7:
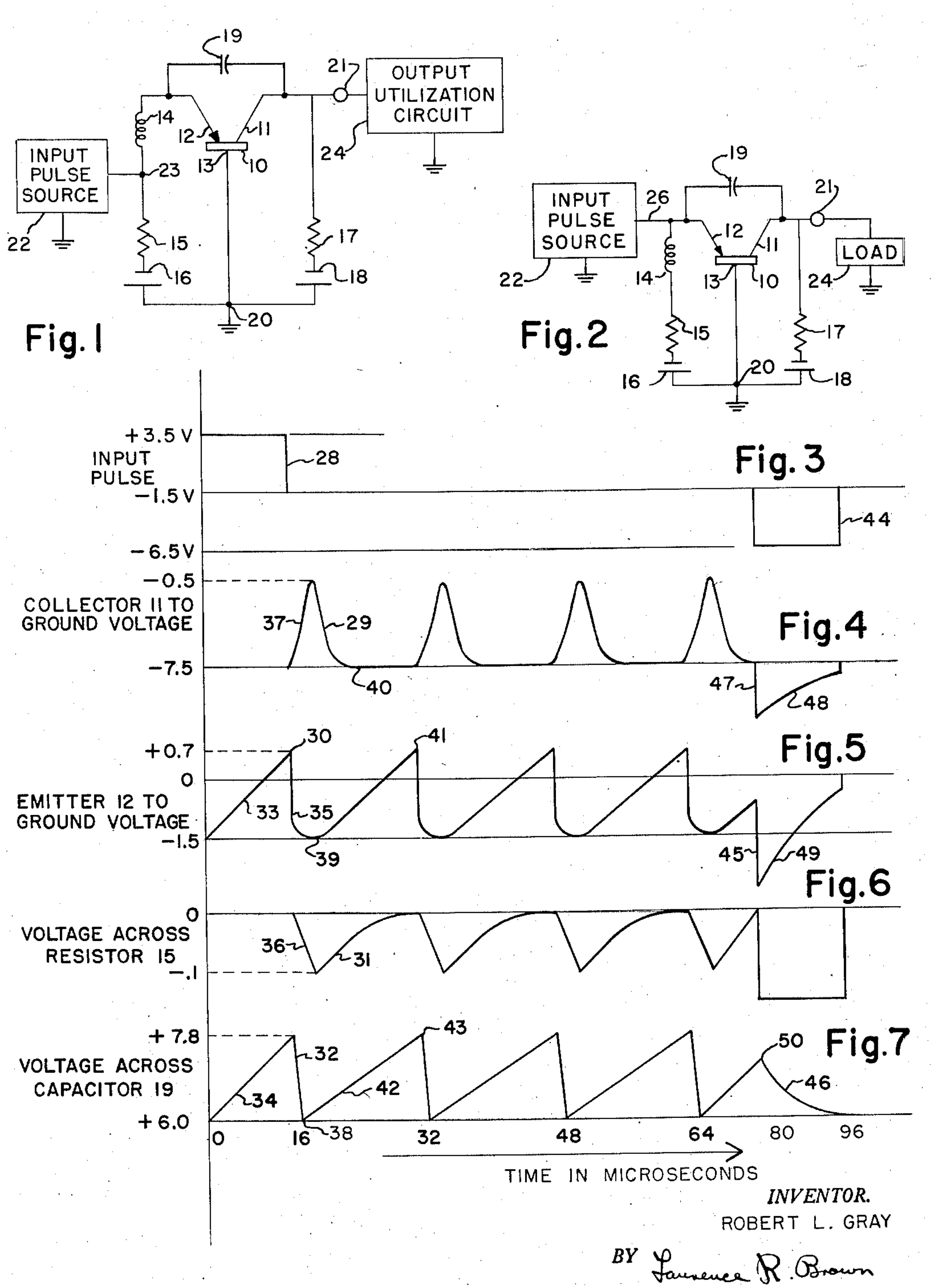
Fig. 1 is a schematic sketch of one bistable state oscillator circuit embodiment of the invention.
Fig. 2 is a schematic sketch of another circuit embodiment of the invention.
Fig. 3 is a waveform diagram of typical input pulses to the oscillator.
Fig. 4 shows the waveform of the oscillator circuit as measured from the collector terminal to ground.
Fig. 5 illustrates the emitter terminal to ground voltage waveform of the oscillator.
Fig. 6 is a waveform of the voltage across a series resistor in the emitter circuit of the oscillator.
Fig. 7 displays the waveform of the voltage across the capacitor which bridges the transistor emitter terminal and collector terminal.

Referring now to Fig. 1, transistor 10 has an emitter terminal 12, a collector terminal 11, and a base terminal 13. The series combination of resistor 17 and voltage source 18 connects the collector electrode 11 to the grounded base electrode 13. The series combination of inductance 14, resistance 15, and voltage source 16 connects the emitter electrode 12 to the base electrode 13. Input terminal 23 connects input pulse source 22 to the emitter electrode at the junction between inductance 14 and resistance 15. Capacitor 19 is connected between the emitter terminal 12 and the collector terminal 11. The output signal is taken from terminal 21 for operation of any suitable utilization circuit 24. Junction 20 which is the common point for the emitter circuit, the collector circuit, and the base circuit is connected to ground, and serves as one terminal of the utilization circuit 24.

In a typical embodiment of the invention as shown in Fig. 1, the following approximate values are used to obtain oscillations at about 60 kilocycles per sec: Resistor 17, 15,000 ohms; voltage source 18, 22.5 volts; inductance 14, 20 henries; resistance 15, 200 ohms; voltage source 16, 1.5 volts; and capacitor 19, .001 microfarad.

The circuit of Fig. 2 is similar to the circuit of Fig. 1 except that the input pulse source 22 of Fig. 2 is connected directly to the emitter electrode 12 at lead 26 between the inductance 14 and capacitor 19 instead of between the resistance 15 and the inductance 14 as in the case of Fig. 1. Thus, the input pulse source may work into a higher impedance load.

Referring now to Fig. 1, the operation of the bistable state oscillator circuit shown therein will be described in detail. The first oscillator state is the off-state in which the transistor is in a steady state non-conductive condition, and the second state is the free running pulse generating or oscillating state in which the transistor alternates at a high frequency between a conductive state and a non-conductive state. As stated hereinbefore, a positive pulse from input pulse source 22 causes the circuit to assume the free running oscillation state whereas a negative pulse causes it to return to the off state, as may be seen from the waveforms of Figs. 3 to 7. Thus, assume that the oscillator resides in the off-state. In this off-state the capacitor 19 is charged by the voltage source 18 in a circuit which may be traced from the positive terminal of source 18 through the lower potential voltage source 16, the resistance 15, the inductance 14, to one plate of capacitor 19. From the negative terminal of voltage source 18, the charging circuit may be traced through the resistance 17 to the other plate of capacitor 19. The resulting charge on capacitor 19, however, is not sufficient to cause the transistor to become conductive because of the bias voltage source 16 which biases the emitter electrode 12 negative with respect to the base electrode 13 to a potential below cutoff. This action is unique in a transistor type circuit since the voltage source 18, used for maintaining a voltage on the collector electrode 11, is of opposite polarity and of less magnitude than that necessary for vacuum tube operation.

When a positive pulse 28, as shown in Fig. 3, is applied to input terminal 23 of Fig. 1, the emitter 12 becomes sufficiently positive with respect to the base terminal 13 to cause the collector electrode 11 of transistor 10 to become conductive. The capacitor 19 then discharges quickly in a circuit extending from one plate of the capacitor 19, emitter 12, collector 11 and back to the other plate of capacitor 19, as seen from the waveforms of Fig. 7. The buildup of a further charge across the capacitor 19, resulting in a charge substantially equal to the maximum amplitude of the input pulse 28 of Fig. 3, is indicated by the portion 34 of the curve of Fig. 7. The emitter voltage also increases during the presence of pulse 28 as indicated by portion 33 of the curve of Fig. 5. When the emitter voltage reaches a point 30, the collector electrode of transistor 10 becomes conductive and the emitter voltage decreases sharply as indicated by portion 35 of the curve of Fig. 5. The emitter current increases rapidly to cause an increase in negative potential across the resistance 15 as shown by the portion 36 of the curve of Fig. 6. Also, as soon as the collector 11 becomes conductive, the capacitor 19 discharges as shown by portion 32 of the curve of Fig. 7. Portion 37 of the curve of Fig. 4 shows the decrease in negative collector voltage when the collector 11 becomes conductive, thereby resulting in a positive going output pulse.

When the capacitor 19 discharges to the point 38 of the curve of Fig. 7, the emitter voltage is no longer sufficient to maintain conduction at the collector 11. Consequently, the transistor 10 will become non-conductive and the emitter voltage will increase from the point 39 to the point 41 of Fig. 5 as the capacitor 19 charges along portion 42 of the curve of Fig. 7. The emitter current will decrease to cause a decrease in the potential drop across the resistor 15 as indicated by curve portion 31 of Fig. 6. The collector voltage will increase in a negative polarity as shown by portion 29 of the curve of Fig. 4 to a point 40 which is about the normal non-conductive value of the collector voltage.

As can be seen from Fig. 7, as soon as the transistor 10 becomes non-conductive, the capacitor 19 begins to recharge to its maximum value as indicated by the portion 42 of the curve of Fig. 7. This recharging of the capacitor 19 is due to the energy stored in the inductance 14 at the time the transistor became non-conductive. The current flow through the inductance 14 at this time is of a polarity adapted to charge the plate of the capacitor connected to the emitter electrode in a positive polarity. When the capacitor charges to a point 43 (in Fig. 7) the potential (point 41, Fig. 5) on the emitter electrode 12 becomes sufficiently large so that the transistor 10 will again become conductive thus starting another cycle of operation. Several cycles of operation are shown in Figs. 4 through 7. Once the circuit is oscillating, it will continue to do so since the capacitor 19 will, during each time interval the transistor is in a non-conductive condition, be recharged by the energy stored in the inductance 14 during the time interval the transistor is in a conductive condition.

If it is desired to terminate the oscillation, a negative pulse 44, as shown in Fig. 3, is applied from the pulse source 22 of Fig. 1, to the input terminal 23. This negative pulse will be in opposition to the capacitor charging current flowing from the inductance 14 and consequently will decrease said current so that the capacitor 19 will not become charged to a potential sufficient to cause the transistor to become conductive. Thus, the regenerative cycle is broken and the circuit will cease to oscillate. In the example shown in Figs. 4 through 7 it can be seen that the negative pulse 44 of Fig. 3 will prevent the capacitor 19 from charging above point 50 of Fig. 7 which is insufficient to cause the transistor 10 to become conductive. Portion 46 of the curve of Fig. 7 shows the decreasing potential across the capacitor 19 during the period of time the negative pulse 44 is impressed on the terminal 23. Further, the negative pulse 44 of Fig. 3 will cause the emitter voltage to decrease sharply as indicated by the portion 45 of the curve of Fig. 5. The collector voltage will also decrease when the negative pulse 44 of Fig. 3 is first applied as is indicated by portion 47 of the curve of Fig. 4. Due to the time constant inherent in the inductance 14 and the capacitor 19, the portions 48 and 49 of the curves of Figs. 4 and 5 respectively will have the shapes shown therein. At the termination of the pulse 44 of Fig. 3, the potentials of the various curves 4 through 7 will return to their normal non-conductive state. It is to be noted that the time scales of all the curves 3 through 7 are the same and are as shown in Fig. 7.

Referring now to Fig. 2, the operation thereof is the same as in the case of Fig. 1 except for the starting and the terminating pulses from input pulse source 25. Consequently, only the operations of the circuit when starting and terminating will be discussed. A positive pulse from the input pulse source 22 upon the input lead 26 will cause the capacitor 19 to become charged to a point where the emitter terminal will be sufficiently positive to cause the transistor 10 to become conductive. Thereafter, the operation of the circuit is substantially the same as with respect to Fig. 1 until the operation is terminated. To terminate the operation of the circuit, a negative pulse is applied to the emitter electrode 12 from pulse source 22 which will prevent the charge on the capacitance 19 from building up to a point sufficiently positive to cause the transistor to become conductive, thus breaking the cycle of operation.

It is clear therefore that a novel and simple bistable state oscillator circuit is provided in accordance with the invention. Therefore, those features of novelty believed descriptive of the nature and scope of the invention are defined with particularity in the following claims.

I claim:

1. A bistable oscillator circuit comprising a transistor with a base terminal, a collector terminal, and an emitter terminal, a capacitor connected between said emitter terminal and said collector terminal, an inductive means connected to said emitter terminal, an impedance means connected in series circuit with said inductive means, a biasing potential source connecting said series circuit to said base terminal, voltage source means to maintain said collector terminal negative with respect to said base terminal, and signal input means connected to said series circuit to apply selectively electrical pulses of two different polarities to the emitter terminal, said inductive means and said capacitor forming an oscillatory circuit which is responsive to a positive pulse from said signal input means to oscillate and is responsive to a negative pulse from said signal input means to cease oscillating and in response to which oscillations said transistor is alternately conductive and non-conductive during separate portions of each oscillation cycle.

2. A bistable oscillator device comprising a transistor with a base terminal, a collector terminal, and an emitter terminal, capacitive reactance means connected between said emitter terminal and said collector terminal, an inductive reactance device connected to said emitter terminal, a series circuit comprising said reactance device and bias voltage supply means connected between the emitter terminal and the base terminal to bias the emitter terminal negative with respect to the base terminal, further power supply means connected between the said collector terminal and the said base terminal and adapted to maintain said collector terminal negative with respect to said base terminal, output circuit means coupled to the collector terminal, and input circuit means adapted to selectively apply positive or negative pulses of sufficient amplitude to respectively initiate and quench self sustaining oscillation of the transistor circuit coupled to said series circuit.

3. A bistable state oscillation circuit comprising in combination, an amplifier device having input, reference and output electrodes, a series resonant circuit comprising an inductor and a capacitor, a circuit coupling the capacitor between the input and output electrodes and the inductor between the input and reference electrodes, means for normally biasing the amplifier device to a non-conductive state, means for supplying discharge current to the output electrode, and means for selectively applying trigger pulses of two different polarities to the input electrode to thereby overcome, with one pulse polarity, the bias to send the amplifier into a conducting state during which the capacitor and inductor determine an oscillation frequency, and to overcome with the other pulse polarity the oscillation state of the amplifier and return it to a non-conductive state.

4. Apparatus as claimed in claim 3 characterized in that said amplifier device comprises a transistor and in that said input, reference, and output electrodes comprise, respectively, emitter, base, and collector electrodes.

References Cited in the file of this patent

UNITED STATES PATENTS

| | | |
|---|---|---|
| 2,533,001 | Eberhard | Dec. 5, 1950 |

FOREIGN PATENTS

| | | |
|---|---|---|
| 700,239 | Great Britain | Nov. 25, 1953 |